(12) United States Patent
Yoon et al.

(10) Patent No.: US 12,158,869 B2
(45) Date of Patent: Dec. 3, 2024

(54) METHOD OF OBTAINING AND IMPUTING MISSING DATA AND MEASUREMENT SYSTEM USING THE SAME

(71) Applicant: SAMSUNG ELECTRONICS CO., LTD., Suwon-si (KR)

(72) Inventors: Seongwook Yoon, Seoul (KR); Sanghoon Sull, Seoul (KR); Jaehyun Kim, Anyang-si (KR); Heejeong Lim, Seoul (KR)

(73) Assignees: SAMSUNG ELECTRONICS CO., LTD., Suwon-si (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 18/149,991

(22) Filed: Jan. 4, 2023

(65) Prior Publication Data

US 2023/0214371 A1     Jul. 6, 2023

(30) Foreign Application Priority Data

Jan. 5, 2022  (KR) .................. 10-2022-0001431

(51) Int. Cl.
*G06F 16/215*     (2019.01)
*G06F 16/2458*    (2019.01)

(52) U.S. Cl.
CPC ........ *G06F 16/215* (2019.01); *G06F 16/2462* (2019.01)

(58) Field of Classification Search
CPC .... G06F 16/2462; G06F 16/215; G06F 17/18; G06F 16/951; G06F 16/22; G06F 2216/03

(Continued)

(56) References Cited

U.S. PATENT DOCUMENTS

| 8,611,639 B2 | 12/2013 | Kul Karni et al. |
| 2004/0176928 A1 | 9/2004 | Johnson |

(Continued)

FOREIGN PATENT DOCUMENTS

| KR | 10-1381300 | 3/2014 |
| KR | 10-2031843 | 10/2019 |
| KR | 10-2070913 | 1/2020 |

*Primary Examiner* — Phong H Nguyen
(74) *Attorney, Agent, or Firm* — F. CHAU & ASSOCIATES, LLC

(57) ABSTRACT

A method of obtaining and imputing missing data and a measurement system having the same are disclosed. The method includes obtaining measurement values of measurement variables, among z variables corresponding to z components of a measurement object, wherein z is a natural number greater than 1, and the z variables of the measurement object include measurement variables and missing variables which are not measured, and the measurement variables are of an amount less than z; generating missing data having the measurement variables with the measurement values and the missing variables with missing values in the z components, wherein each of the missing values is predetermined value indicating that a missing variable has not been measured; generating k pieces of final imputation data having k final imputation values, by using the missing data, wherein k is a natural number greater than 1, each of the k final imputation values are in the z components, and using the missing data includes performing multiple imputations on the missing data; and generating average data having average component values in the z components, wherein each of the average component values in a component is an average value of the k final imputation values of the k pieces of final imputation data in the component, and selecting, in each of the z components, a next measurement variable, wherein a difference value between a final imputation values and an average component value, of the next (Continued)

measurement variable, is larger than a difference value of the missing variables.

19 Claims, 13 Drawing Sheets

(58) Field of Classification Search
USPC .............................. 707/692, 741, 769, 802
See application file for complete search history.

(56) References Cited

U.S. PATENT DOCUMENTS

| | | | |
|---|---|---|---|
| 2005/0071807 A1 | 3/2005 | Yanavi | |
| 2014/0201126 A1 | 7/2014 | Zadeh et al. | |
| 2016/0343080 A1* | 11/2016 | Weng | G06F 16/215 |
| 2017/0075959 A1* | 3/2017 | Branson | G06F 16/24568 |
| 2019/0294962 A1* | 9/2019 | Vezer | G06N 7/01 |
| 2020/0297233 A1* | 9/2020 | Mitchell | A61B 5/6804 |
| 2020/0410194 A1* | 12/2020 | Kim | G06V 40/1306 |
| 2021/0223430 A1* | 7/2021 | Runciman | G06F 9/545 |
| 2022/0179948 A1* | 6/2022 | Prudkovskiy | G06F 21/562 |

* cited by examiner (x1,y1)

| 3 | 5 | 5 | 5 |
|---|---|---|---|
| 0 | 0 | 4 | 2 |
| 0 | 1 | 4 | 0 |
| 0 | 4 | 1 | 0 |

(x1,y4)
(x3,y3)
(x4,y1)
(x4,y4)

FIG. 8 ded (x1,y1)

| ? | ? | ? | ? |
|---|---|---|---|
| ? | ? | ? | ? |
| ? | ? | 4 | ? |
| ? | ? | ? | ? |

|  | dev1 |  |  |
|---|---|---|---|
| 2 | 2 | 2 | 1 |
| 0 | 3 | 1 | 0 |
| 0 | 0 | 0 | 0 |
| 0 | 1 | 0 | 0 |

(x1,y1) top-left, (x1,y4) top-right, (x3,y3) middle, (x4,y1) bottom-left, (x4,y4) bottom-right

|  | dev2 |  |  |
|---|---|---|---|
| 1 | 3 | 1 | 1 |
| 0 | 3 | 1 | 2 |
| 0 | 0 | 0 | 0 |
| 0 | 0 | 0 | 0 |

|  | dev3 |  |  |
|---|---|---|---|
| 1 | 1 | 0 | 1 |
| 0 | 6 | 2 | 1 |
| 0 | 0 | 0 | 0 |
| 0 | 0 | 0 | 0 |

(x2,y2)

|  | vard |  |  |
|---|---|---|---|
| 3 | 7 | 3 | 2 |
| 0 | 27 | 3 | 3 |
| 0 | 0 | 0 | 0 |
| 0 | 1 | 0 | 0 |

|  | stddev |  |  |
|---|---|---|---|
| 2 | 3 | 2 | 1 |
| 0 | 5 | 2 | 2 |
| 0 | 0 | 0 | 0 |
| 0 | 1 | 0 | 0 |

|  | ded |  |  |
|---|---|---|---|
| ? | 5 | 5 | ? |
| ? | 0 | 4 | ? |
| ? | ? | 4 | ? |
| ? | ? | ? | ? |

(x1,y1), (x1,y4), (x3,y3), (x4,y1), (x4,y4)

FIG. 13 sed1

| (x1,y1) | | | (x1,y4) |
|---|---|---|---|
| 3 | 5 | 5 | 5 |
| 0 | 0 | 4 | 2 |
| 0 | 1 | 4 | 0 |
| 0 | 4 | 1 | 0 |
| (x4,y1) | | | (x4,y4) | sed2

| 0 | 5 | 5 | 3 |
|---|---|---|---|
| 0 | 0 | 4 | 0 |
| 0 | 1 | 4 | 0 |
| 0 | 5 | 1 | 0 |

FIG. 16 mied1

| (x1,y1) | | | (x1,y4) |
|---|---|---|---|
| 3 | 5 | 5 | 5 |
| 0 | 0 | 4 | 2 |
| 0 | 2 | 4 | 1 |
| 0 | 4 | 2 | 0 |
| (x4,y1) | | | (x4,y4) | mied2

| 2 | 5 | 5 | 3 |
|---|---|---|---|
| 0 | 0 | 3 | 1 |
| 0 | 2 | 4 | 0 |
| 1 | 5 | 2 | 0 |

FIG. 17 ied1

| (x1,y1) | | | (x1,y4) |
|---|---|---|---|
| 3 | 5 | 5 | 5 |
| 0 | 0 | 4 | 2 |
| 0 | 2 | 4 | 1 |
| 0 | 4 | 2 | 0 |
| (x4,y1) | | | (x4,y4) | ied2

| 2 | 5 | 5 | 3 |
|---|---|---|---|
| 0 | 0 | 4 | 1 |
| 0 | 2 | 4 | 0 |
| 1 | 5 | 2 | 0 |

FIG. 18

METHOD OF OBTAINING AND IMPUTING MISSING DATA AND MEASUREMENT SYSTEM USING THE SAME

CROSS-REFERENCE TO THE RELATED APPLICATION

This patent application claims priority under 35 U.S.C. § 119 to Korean Patent Application No. 10-2022-0001431, filed on Jan. 5, 2022, in the Korean Intellectual Property Office, the disclosure of which is incorporated by reference herein in its entirety.

TECHNICAL FIELD

The present disclosure relates to a method of obtaining and imputing missing data and a measurement system using the same.

DISCUSSION OF THE RELATED ART

A manufacturing process of a semiconductor memory device may include forming and stacking patterns on different layers on a wafer. The patterns formed on each layer should be formed as designed to perform an operation of the semiconductor memory device as designed.

A semiconductor measurement system may perform measurement or inspection before and after each process to check whether the patterns formed in each process are correct. Generally, the semiconductor measurement system may generate complete data of a measurement object only when measurement values are obtained from all measurement components of the measurement object.

Accordingly, a technology of effectively obtaining missing data while reducing the number of measurements without obtaining the measurement values from the all measurement components of the measurement object and imputing the missing data to generate valid imputation data close to the complete data is needed.

SUMMARY

The exemplary embodiments of the disclosure provide a method of obtaining and imputing missing data capable of generating valid imputation data by obtaining the missing data and imputing the missing data without complete data, and a measurement system using the same.

Objects of embodiments of the present disclosure are not limited to the aforementioned objects, and other unmentioned objects will be clearly understood by those skilled in the art based on the following description of the disclosure.

In accordance with an exemplary embodiment of the disclosure, a method of obtaining and imputing missing data includes: obtaining measurement values of measurement variables, among z variables corresponding to z components of a measurement object, wherein z is a natural number greater than 1, and the z variables of the measurement object include measurement variables and missing variables which are not measured, and the measurement variables are of an amount less than z; generating missing data having the measurement variables with the measurement values and the missing variables with missing values in the z components, wherein each of the missing values is predetermined value indicating that a missing variable has not been measured; generating k pieces of final imputation data having k final imputation values, by using the missing data, wherein k is a natural number greater than 1, each of the k final imputation values are in the z components, and using the missing data includes performing multiple imputations on the missing data; and generating average data having average component values in the z components, wherein each of the average component values in a component is an average value of the k final imputation values of the k pieces of final imputation data in the component, and selecting, in each of the z components, a next measurement variable, wherein a difference value between a final imputation values and an average component value, of the next measurement variable, is larger than a difference value of the missing variables.

In accordance with an exemplary embodiment of the disclosure, a method of obtaining and imputing missing data includes: receiving m pieces of candidate data, each including candidate values in z components, wherein m is a natural number greater than 1, and z is a natural number greater than 1; obtaining a similarity between each of the m pieces of candidate data and missing data to obtain m similarities; selecting k pieces of candidate data having a similarity smaller than or equal to a threshold value among the m similarities as k pieces of final candidate data, wherein k is a natural number greater smaller than m; substituting final candidate values in components among the z components of each of the k pieces of final candidate data equal to measurement components having measurement values of measurement variables among the z components of the missing data with the measurement value in the measurement components of the missing data to generate k pieces of substitution data; imputing each of the k pieces of substitution data to generate k pieces of intermediate imputation data; and generating the k pieces of final imputation data for the k pieces of intermediate imputation data using the missing data.

In accordance with an exemplary embodiment of the disclosure, a measurement system includes: a measurement instrument configured to generate a measurement value of at least one measurement variable among z variables of a measurement object in response to a driving control signal, wherein z is a natural number greater than 1; and a controller configured to obtain the measurement value of the measurement variable, generate missing data having the measurement value of the measurement variable and missing values of remaining missing variables which are not measured, in z components, obtain an average value of final imputation values of each component of k pieces of final imputation data to obtain average data having the average values in the z components, select a variable of a component having a maximum difference value except for the measurement variable as a next measurement variable using a difference value between the final imputation value and the average value of each component of each of the k pieces of final imputation data and the average data, and generate the driving control signal based on the next measurement variable, wherein the measurement values are obtained from n measurement variables of n measurement components, among the z variables of the measurement object, k is a natural number, and n is a natural number smaller than z.

BRIEF DESCRIPTION OF THE DRAWINGS

FIG. 8 is a diagram illustrating complete data of an image of a measurement object according to an exemplary embodiment of the inventive concept.

FIG. 9 is a diagram illustrating missing data according to an exemplary embodiment of the inventive concept.

FIG. 10 is a drawing illustrating final imputation data according to an exemplary embodiment of the inventive concept.

FIG. 11 is a drawing illustrating average data according to an exemplary embodiment of the inventive concept.

FIG. 12 is a diagram illustrating deviation data, sample variance data, and standard deviation data according to an exemplary embodiment of the inventive concept.

FIG. 13 is a diagram illustrating missing data according to an exemplary embodiment of the inventive concept.

FIG. 16 is a diagram illustrating substitution data according to an exemplary embodiment of the inventive concept.

FIG. 17 is a diagram illustrating intermediate imputation data according to an exemplary embodiment of the inventive concept.

FIG. 18 is a diagram illustrating final imputation data according to an exemplary embodiment of the inventive concept.

DETAILED DESCRIPTION OF EXEMPLARY EMBODIMENTS

Hereinafter, a method of obtaining and imputing missing data and a measurement system using the same according to exemplary embodiments of the inventive concept will be described with reference to the accompanying drawings.

Figure 1:
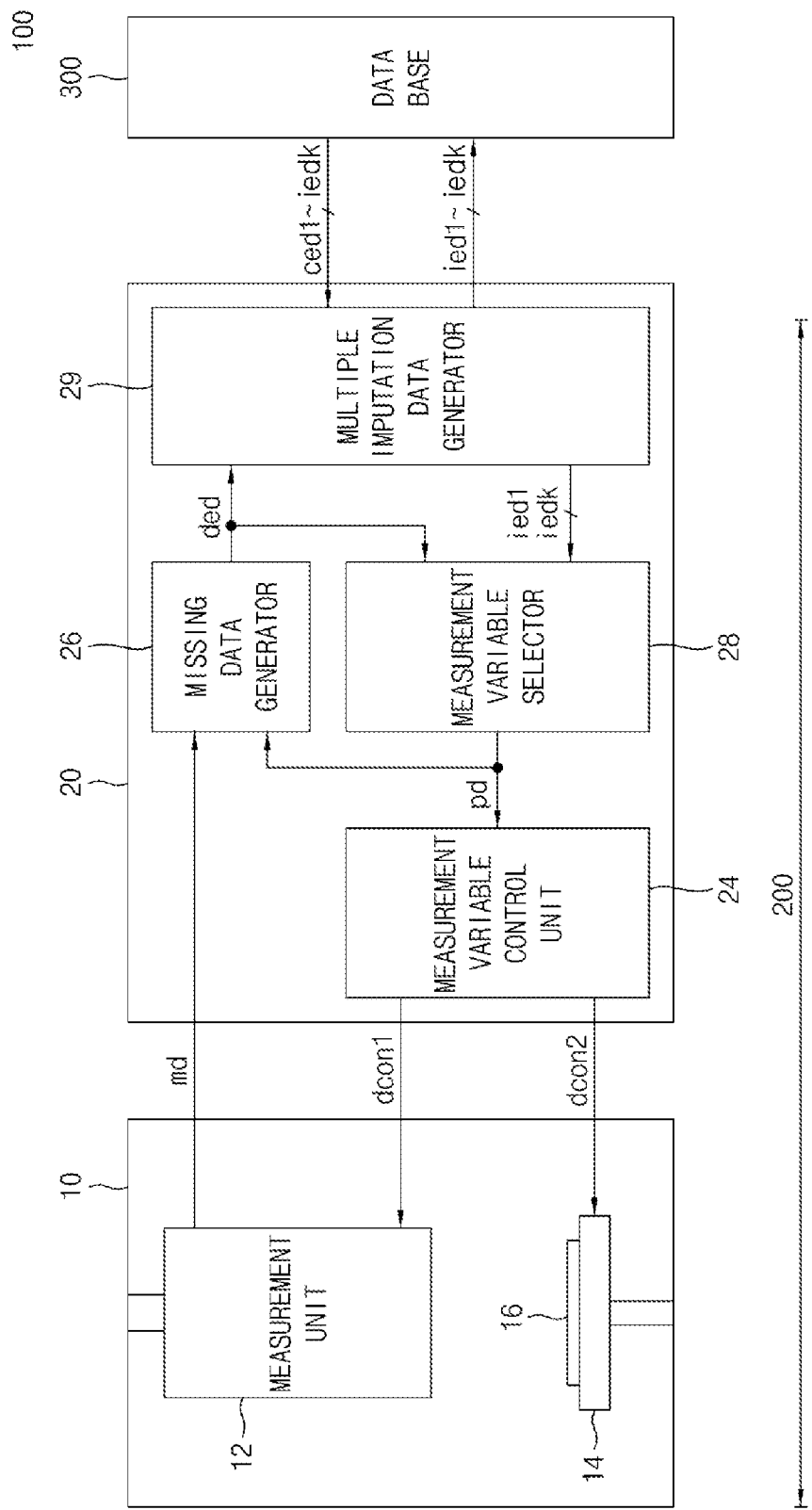
FIG. 1 is a block diagram schematically illustrating a measurement system according to an exemplary embodiment of the inventive concept.

FIG. 1 is a block diagram schematically illustrating a measurement system according to an exemplary embodiment of the inventive concept.

With reference to FIG. 1, the measurement system 100 may include a measurement apparatus 200 and a database 300. The measurement apparatus 200 may include a measurement instrument 10 and a controller 20. The measurement instrument 10 may include a measurement unit 12 and a stage 14, and a measurement object may be positioned on the stage 14. The measurement unit 12 is an image acquisition device, such as a camera. The controller 20 may include a measurement variable control unit 24, a missing data generator 26, a measurement variable selector 28, and a multiple imputation data generator 29. The controller includes at least one processor.

A function of each of the blocks as shown in FIG. 1 will be described below.

The measurement unit 12 may output a measurement variable of a measurement object 16, having a measurement value md, in response to a first driving control signal dcon1. The measurement unit 12 may select a measurement method according to the measurement variable of the measurement object 16 to obtain the measurement value md in response to the first driving control signal dcon1. For example, when the measurement unit 12 obtains an image of the measurement object 16, the measurement variable selected by the measurement unit 12 may be one pixel, and the measurement value md may be a value of the pixel. In this example, the measurement unit 12 may select the pixel from pixels of the image, and the value of the pixel from values of the pixels of partial images obtained from different positions. When the measurement unit 12 obtains various characteristics (for example, a current, a voltage, a resistance, a temperature, etc.), the measurement variable may be one among the various characteristics and the measurement value md may be one among values of the various characteristics obtained from one position.

The stage 14 may move a measurement position of the measurement object 16 in response to driving control signals received from measurement instrument 10, for example, a second driving control signal dcon2.

The measurement variable controller 24 may output the driving control signals based on the measurement variable pd received from measurement variable selector 28, including the first driving control signal dcon1 and/or a second driving control signal dcon2.

The missing data generator 26 may generate the missing data ded based on the measurement variable pd and the measurement value md. For example, the missing data ded may be data including measurement values and missing values. Values of n measurement variables, of n measurement components, among z variables of the measurement object 16 may be expressed as the measurement values, wherein n is a natural number smaller than z, and values of the missing variables which are not measured among the z variables may be expressed as a predetermined missing value (for example, "0" or NaN (not a number), etc.). The missing value may indicate that a corresponding missing variable has not been measured.

The measurement variable selector 28 may calculate and select a next measurement variable pd using the missing data ded and k pieces of final imputation data from ied1 to iedk, where k is a natural number greater than or equal to 2).

The multiple imputation data generator 29 may generate the k pieces of final imputation data from ied1 to iedk using the missing data ded and m pieces of candidate data from ced1 to cedm, wherein m is a natural number greater than or equal to k.

The database 300 may store the k pieces of final imputation data from ied1 to iedk, and output the m pieces of candidate data from ced1 to cedm. The m pieces of candidate data from ced1 to cedm may be data related to complete data of the measurement object 16. For example, when the complete data of the measurement object 16 is a number "7", the m pieces of candidate data from ced1 to cedm may be various numbers such as "0" to "6", "8", and "9".

In FIG. 1, the missing data generator 26, the measurement variable selector 28, and the multiple imputation data generator 29 may be configured as one function block. Further, each of the missing data generator 26, the measurement variable selector 28, and the multiple imputation data generator 29 is a software program that is executed by the controller.

Figure 2:
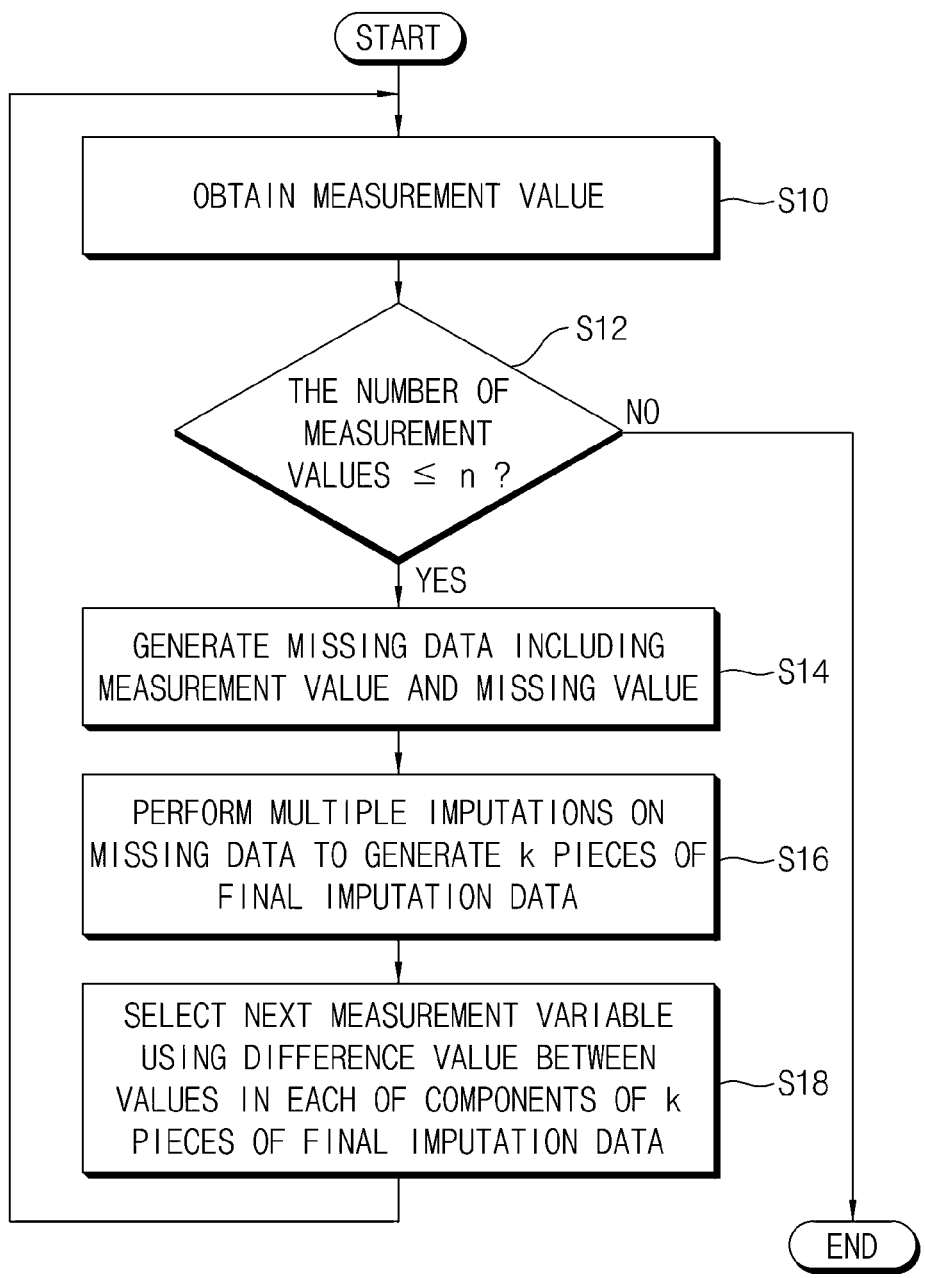
FIG. 2 is an operation flowchart describing an operation of a controller according to an exemplary embodiment of the inventive concept.

FIG. 2 is an operation flowchart for describing an operation of a controller according to an exemplary embodiment of the inventive concept.

With reference to FIG. 1 and FIG. 2, in step S10, the missing data generator 26 obtains the measurement value md from the measurement unit 12. Then the missing data generator 26 may determine whether the number of the measurement value md (or the measurement variable pd) is n or less in step S12. Here, when the measurement object 16 includes z variables, n may be a number considerably smaller than z.

In step S12, when the condition, i.e., the number of measurement values are less than or equal to n, is not satisfied, the controller 20 may end an operation. In step S12, when the condition, i.e., the number of measurement values are less than or equal to n, is satisfied, the missing data generator 26 may generate missing data ded including the measurement value md and missing value in step S14. The generated missing data ded may be expressed as data of one or more dimensions. For example, the missing data ded may be expressed as one-dimensional vector data or two-dimensional matrix data. Also, the missing data ded may include the measurement value md or the missing value in each component. In some cases, when the missing data is expressed as the two-dimensional matrix data, the missing data may include z components defined by, for example, x rows and y columns, and each component may be expressed as the corresponding rows and columns that define that component. The missing data includes the measurement values md in measurement components (corresponding to the measurement variables) among the z components and the missing values in missing components among the z components.

The multiple imputation data generator 29 may use the missing data ded, for example, by performing multiple imputations on the missing data ded, to generate k pieces of final imputation data in step S16. For example, the multiple imputation data generator 29 may perform the multiple imputations on the missing data ded using the m pieces of candidate data from ced1 to cedm to generate k pieces of final imputation data from ied1 to iedk. For example, each of the m pieces of candidate data from ced1 to cedm may be expressed as one-dimensional vector data or two-dimensional matrix data, and z candidate values may be included in the z components of each of the m pieces of candidate data from ced1 to cedm.

The measurement variable selector 28 may select a next measurement variable pd using a difference value between final imputation values in each of the components of the k pieces of final imputation data from ied1 to iedk in step S18. For example, each of the k pieces of final imputation data, from ied1 to iedk, may be expressed as one-dimensional vector data or two-dimensional matrix data, and z final imputation values may be included in the z components of each of the k pieces of final imputation data from ied1 to iedk.

As described above with reference to FIG. 2, when the measurement value md is obtained, the number of the measurement values md of the missing data ded may increase and the number of the missing values of the missing data ded may decrease. Further, whenever the measurement value md is obtained, the controller 20 may generate the k pieces of final imputation data from ied1 to iedk on the missing data ded and select the next measurement variable pd using the k pieces of final imputation data from ied1 to iedk.

Figure 3:
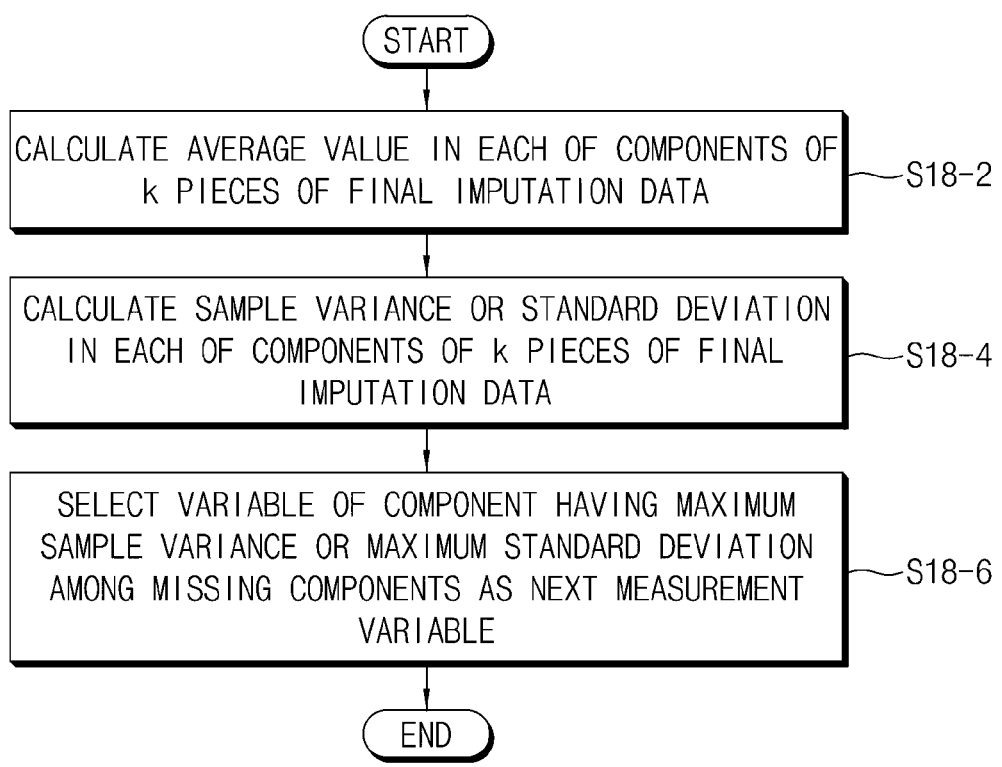
FIG. 3 is an operation flowchart describing an operation of a measurement variable selector according to an exemplary embodiment of the inventive concept.

FIG. 3 is an operation flowchart for describing an operation of a measurement variable selector according to an exemplary embodiment of the inventive concept.

With reference to FIG. 1 to FIG. 3, the measurement variable selector 28 may calculate an average value of final imputation values in each of the components of the k pieces of final imputation data from ied1 to iedk to generate average data in step S18-2. For example, the average data may be expressed as one-dimensional vector data or two-dimensional matrix data, and z average values may be included in the z components of the average data.

The measurement variable selector 28 may calculate a sample variance in each of the components of sample variance data using the k pieces of final imputation data from ied1 to iedk. The measure variable selector 28 may also calculate a standard deviation in each of the standard deviation data using the average data in step S18-4. In some cases, the measurement variable selector 28 may generate k deviation data using a difference value between the final imputation value in each of the components of the k pieces of final imputation data from ied1 to iedk and the average value in each of the components of the average data, and generate the sample variance data or the standard deviation data using the k pieces of deviation data. For example, each of the k pieces of deviation data may be expressed as one-dimensional vector data or two-dimensional matrix data, and z deviations may be included in the z components of the k pieces of deviation data. Each of the sample variance data and the standard deviation data may be expressed as one-dimensional vector data or two-dimensional matrix data, z sample variance values may be included in the z components of the sample variance data, and z standard deviations may be included in the z components of the standard deviation data.

The measurement variable selector 28 may select a variable of a component having a maximum sample variance or a maximum standard deviation among the missing components of the missing data ded (except for the measurement components in which there are the measurement values of the missing data ded) as a next measurement variable pd in step S18-6.

Steps S18-2, S18-4, and S18-6 as shown in FIG. 3 may be included in step S18 as shown in FIG. 2.

According to an exemplary embodiment of the inventive concept, the measurement variable selector 28 may select the variable having a maximum uncertainty among the missing variables of the missing components of the missing data ded as the next measurement variable. Therefore, the uncertainty of the missing data may be effectively removed.

According to an exemplary embodiment of the inventive concept, the measurement variable selector 28 may obtain the measurement values from arbitrary n measurement variables among the variables of the measurement object 16.

Figure 4:
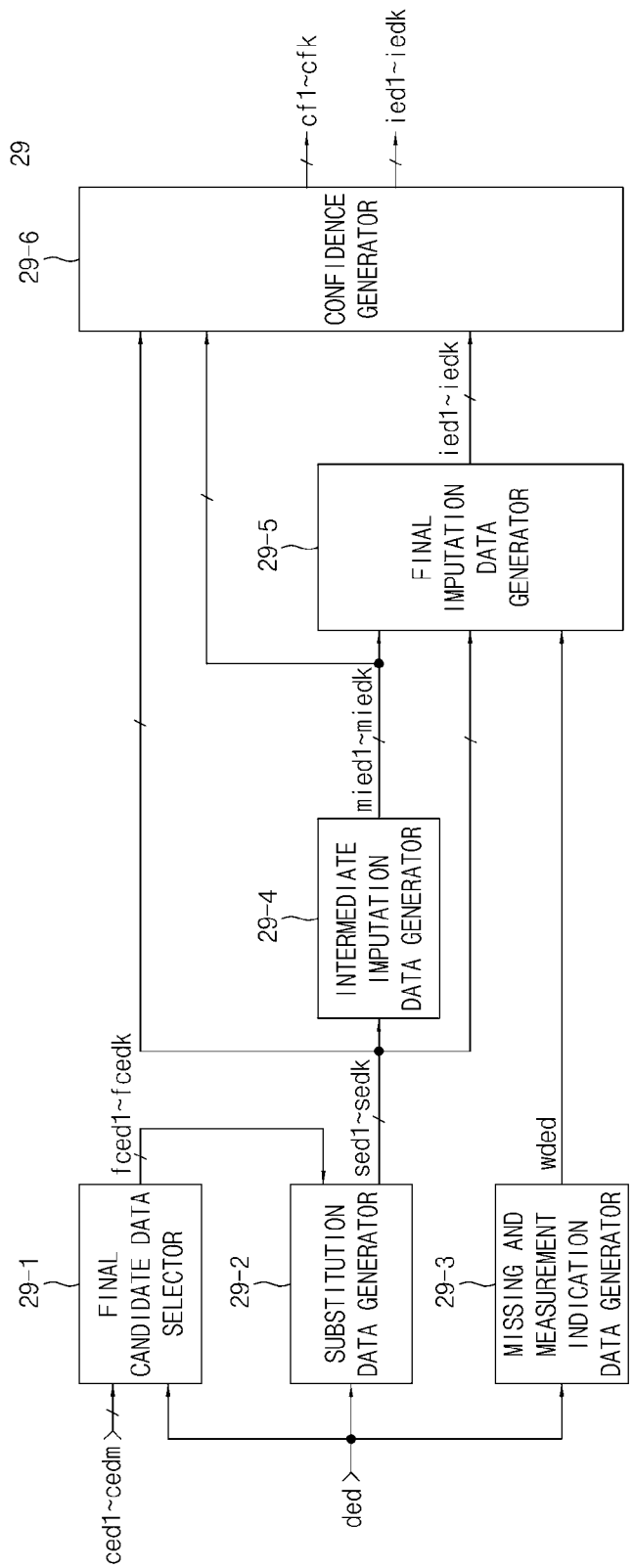
FIG. 4 is a block drawing illustrating a configuration of multiple imputation data generators according to an exemplary embodiment of the inventive concept.

FIG. 4 is a block drawing illustrating a configuration of a multiple imputation data generator according to an exemplary embodiment of the inventive concept. The multiple imputation data generator 29 may include a final candidate data selector 29-1, a substitution data generator 29-2, a missing and measurement indication data generator 29-3, an intermediate imputation data generator 29-4, and a final imputation data generator 29-5. The multiple imputation data generator 29 may further include a confidence generator 29-6. Each of the final candidate data selector 29-1, the substitution data generator 29-2, the missing and measurement indication data generator 29-3, the intermediate imputation data generator 29-4, the final imputation data generator 29-5 and the confidence generator 29-6 is a software sub-program of the multiple imputation data generator 29.

A function of each of the blocks as shown in FIG. 4 will be described below.

The final candidate data selector 29-1 may receive the missing data ded and the m pieces of candidate data from ced1 to cedm, and select and generate k pieces of candidate data similar to the missing data ded among the m pieces of candidate data from ced1 to cedm as the k pieces of final candidate data fced1 to fcedk. For example, each of the m pieces of candidate data from ced1 to cedm may be expressed as one-dimensional vector data or two-dimensional matrix data, and z candidate values may be included in the z components of each of the m pieces of candidate data from ced1 to cedm. Each of the k pieces of final candidate data from fced1 to fcedk may be expressed as on-dimensional vector data or two-dimensional matrix data, and z final candidate values may be included in the z components of each of the k pieces of final candidate data from fced1 to fcedk.

The substitution data generator 29-2 may be configured to receive the missing data ded and the k pieces of final candidate data from fced1 to fcedk, and substitute final candidate values in components of each of the k pieces of final candidate data from fced1 to fcedk equal to the measurement components of the missing data ded with the measurement values of the measurement components of the missing data ded to generate the k pieces of substitution data from sed1 to sedk. For example, each of the k pieces of substitution data from sed1 to sedk may be expressed as one-dimensional vector data or two-dimensional matrix data, and z substitution values may be included in the z components of each of the k pieces of substitution data from sed1 to sedk.

The missing and measurement indication data generator 29-3 may be configured to receive the missing data ded, substitute the measurement values of the missing data ded with "1", substitute the missing values of the missing data ded with "0", and generate missing and measurement indication data wded. For example, the missing and measurement indication data may be expressed as one-dimensional data or two-dimensional data, and z missing and measurement indication values may be included in the z components of the missing and measurement indication data.

The intermediate imputation data generator 29-4 may impute the k pieces of substitution data from sed1 to sedk to generate k pieces of intermediate imputation data from mied1 to miedk. The intermediate imputation data generator 29-4 may generate the k pieces of intermediate imputation data from mied1 to miedk using various imputation methods. For example, each of the k pieces of intermediate imputation data from mied1 to miedk may be expressed as one-dimensional vector data or two-dimensional matrix data, and z intermediate imputation values may be included in the z components of each of the k pieces of intermediate imputation data from mied1 to miedk. As an exemplary embodiment, the intermediate imputation data generator 29-4 may be configured to generate the k pieces of intermediate imputation data from mied1 to miedk using algorithms, including using a neural network. In an exemplary embodiment, the imputation data generator 29-4 may be configured to generate the intermediate imputation data using a machine learning model trained using a neural network.

The final imputation data generator 29-5 may receive the k pieces of intermediate imputation data from mied1 to miedk, the k pieces of substitution data from sed1 to sedk, and the missing and measurement indication data wded, and generate the k pieces of final imputation data from ied1 to iedk for the k pieces of intermediate imputation data from mied1 to miedk using the missing and measurement indication data wded and the k pieces of substitution data from sed1 to sedk. That is, the final imputation data generator 29-5 may substitute intermediate imputation values in components of each of the k pieces of intermediate imputation data from mied1 to miedk equal to components having "1" among components of the missing and measurement indication data wded with substitution values (that is, measurement values) in components of each of the k pieces of substitution data from sed1 to sedk equal to the components having "1" among the components of the missing and measurement indication data wded to generate the k pieces of final imputation data from ied1 to iedk.

The confidence generator 29-6 may receive the k pieces of substitution data from sed1 to sedk, the k pieces of intermediate imputation data from mied1 to miedk, and the k pieces of final imputation data from ied1 to iedk, obtain a first difference value between a sum of the substitution values of each of the k pieces of substitution data from sed1 to sedk and a sum of the intermediate imputation values of each of the k pieces of intermediate imputation data from mied1 to miedk and a second difference value between a sum of the intermediate imputation values of each of the k pieces of intermediate imputation data from mied1 to miedk and a sum of the final imputation values of each of the k pieces of final imputation data from ied1 to iedk, and obtain and obtain and generate confidences cf1 to cfk for the k pieces of final imputation data from ied1 to iedk using the k first difference values and the k second difference values.

Figure 5A:
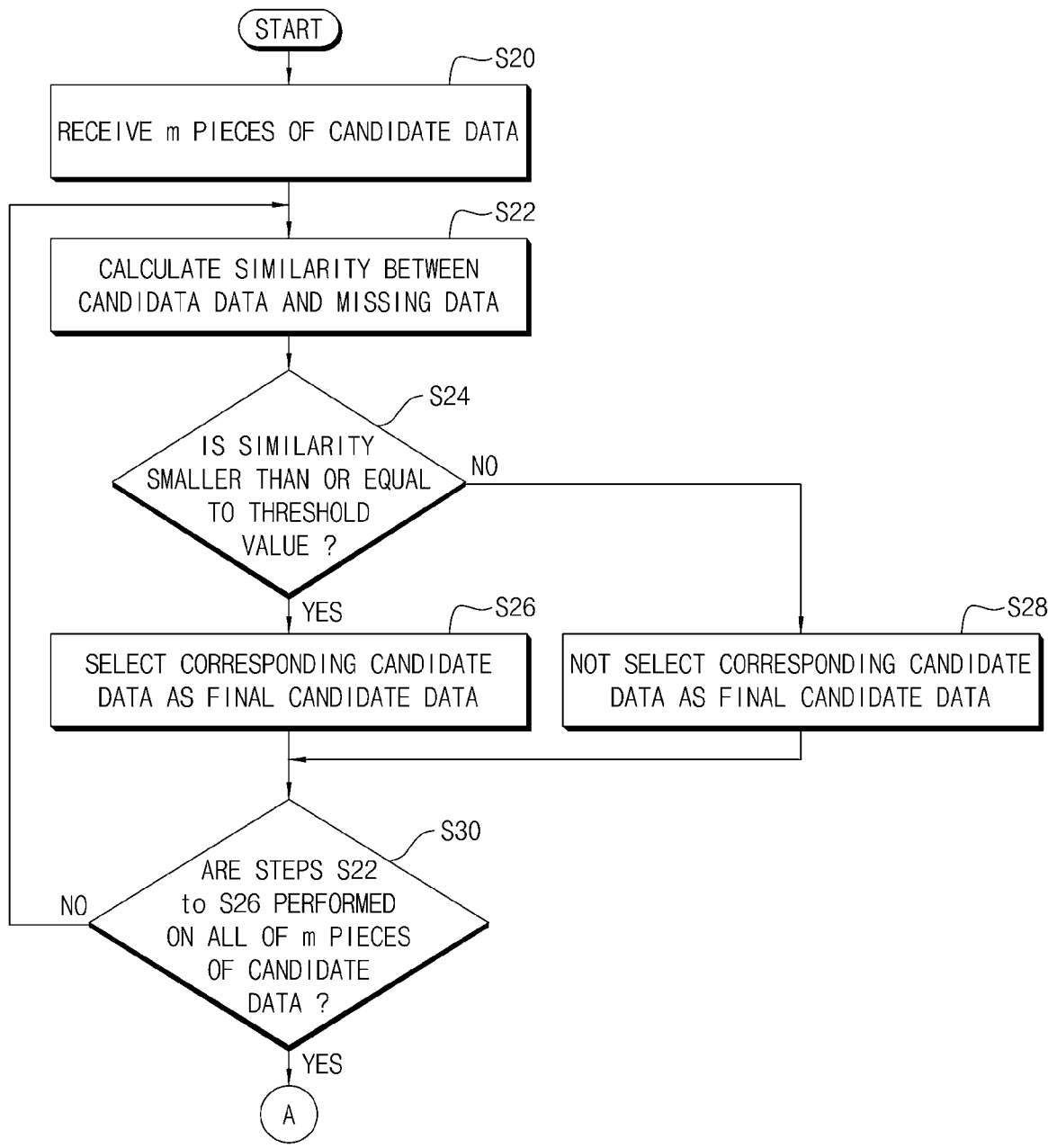
FIG. 5A and FIG. 5B are operation flowcharts describing an operation of a multiple imputation data generator according to an exemplary embodiment of the inventive concept.
Figure 5B:
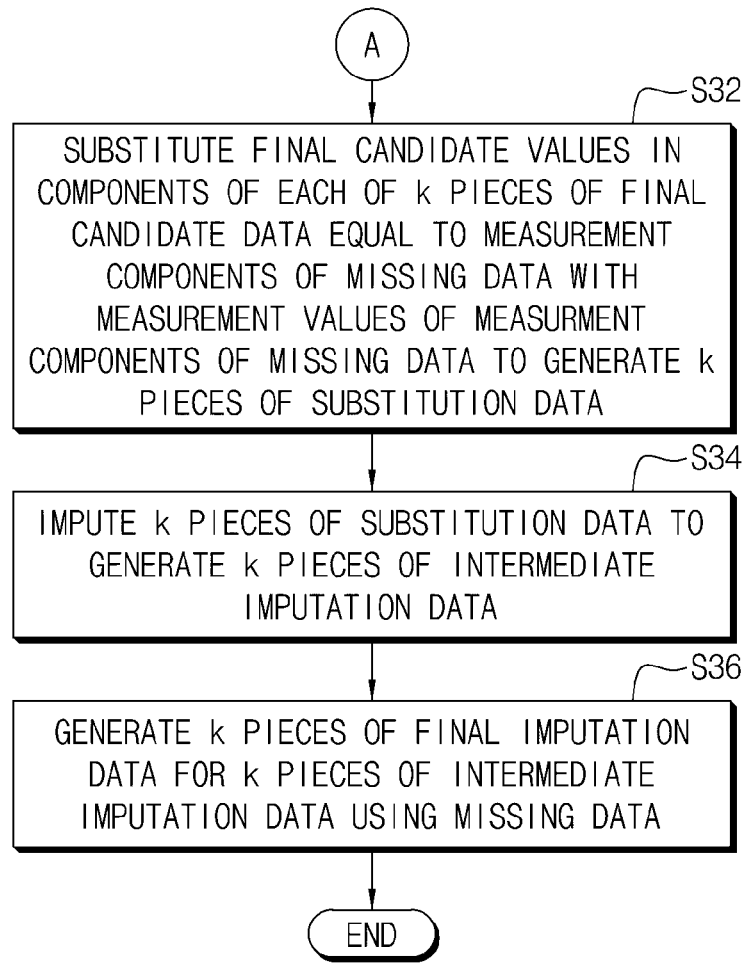

As an exemplary embodiment, the confidence generator 29-6 may be configured to generate only final imputation data in which the confidence is greater than a predetermined value among the k piece of final imputation data from ied1 to iedk FIG. 5A and FIG. 5B are operation flowcharts for describing an operation of a multiple imputation data generator according to an exemplary embodiment of the inventive concept.

With reference to FIG. 4, FIG. 5A, and FIG. 5B, an operation of the multiple imputation data generator 29 will be described below.

The final candidate data selector 29-1 may receive m pieces of candidate data from ced1 to cedm from the database 300 in step S20.

The final candidate data selector 29-1 may calculate a similarity between one among the m pieces of candidate data from ced1 to cedm and the missing data ded in step S22. For example, the similarity may be obtained by a difference value between a sum of the candidate values in components of one among the m pieces of candidate data from ced1 to cedm equal to the measurement components of the missing data ded and a sum of the measurement values of the measurement components of the missing data ded.

The final candidate data selector 29-1 may determine whether the similarity is smaller than or equal to a threshold value in step S24.

When step S24 is satisfied, the final candidate data selector 29-1 may select one among the m pieces of candidate data from ced1 to cedm as one of the k pieces of final candidate data from fced1 to fedk in step S26.

When step S24 is not satisfied, the final candidate data selector 29-1 may not select one of the m pieces of candidate data from ced1 to cedm as one of the k pieces of final candidate data from fced1 to fcedk in step S28. The result of step S28 will be forwarded to S30, and the candidate data that go to step S28 will be distinguished from the candidate data that has not gone to step S28 and S26.

The final candidate data selector 29-1 may determine whether steps S22 to S26 are performed on all of the m pieces of candidate data from ced1 to cedm in step S30.

When step S30 is not satisfied, the final candidate data selector 29-1 may go to step S22 to perform steps S22 to S28 on the remaining candidate data among the m pieces of candidate data from ced1 to cedm.

When step S30 is satisfied, with reference to FIG. 5B, the substitution data generator 29-2 may substitute the final candidate values in components of each of the k pieces of final candidate data from fced1 to fcedk equal to the measurement components of the missing data ded with the measurement values of the measurement components of the missing data ded to generate k pieces of substitution data from sed1 to sedk in step S32.

The missing and measurement indication data generator 29-3 may substitute the measurement values of the missing data ded with "1" and the missing values of the missing data ded with "0" to generate the missing and measurement indication data wded.

The intermediate imputation data generator 29-4 may impute the k pieces of substitution data from sed1 to sedk to generate the k pieces of intermediate imputation data from mied1 to miedk in step S34.

The final imputation data generator 29-5 may generate the k pieces of final imputation data from ied1 to iedk for the k pieces of intermediate imputation data from mied1 to miedk using the missing data ded in step S36. For example, the final imputation data generator 29-5 may substitute the intermediate imputation values in components of each of the k pieces of intermediate imputation data from mied1 to miedk equal to the measurement components of the missing data ded with the measurement values of the measurement components of the missing data ded, and generate the k pieces of final imputation data from ied1 to iedk.

As another example, the final imputation data generator 29-5 may generate the k pieces of final imputation data from ied1 to iedk for the k pieces of intermediate imputation data from mied1 to miedk using the missing data ded and the missing and measurement indication data wded. For example, the final imputation data generator 29-5 may substitute the intermediate imputation values in components of each of the k pieces of intermediate imputation data from mied1 to miedk equal to components having "1" of the missing and measurement indication data wded with the measurement values of the measurement components of the missing data ded, and generate the k pieces of final imputation data ied2 to iedk. In one exemplary embodiment, the final imputation data generator 29-5 may substitute final candidate values in components among the z components of each of the k pieces of final candidate data equal to the measurement components of the missing data with the measurement values in the measurement components of the missing data to generate the k pieces of substitution data.

Steps S20 to S36 as shown in FIG. 5A and FIG. 5B may be included in step S16 as shown in FIG. 2.

Figure 6:
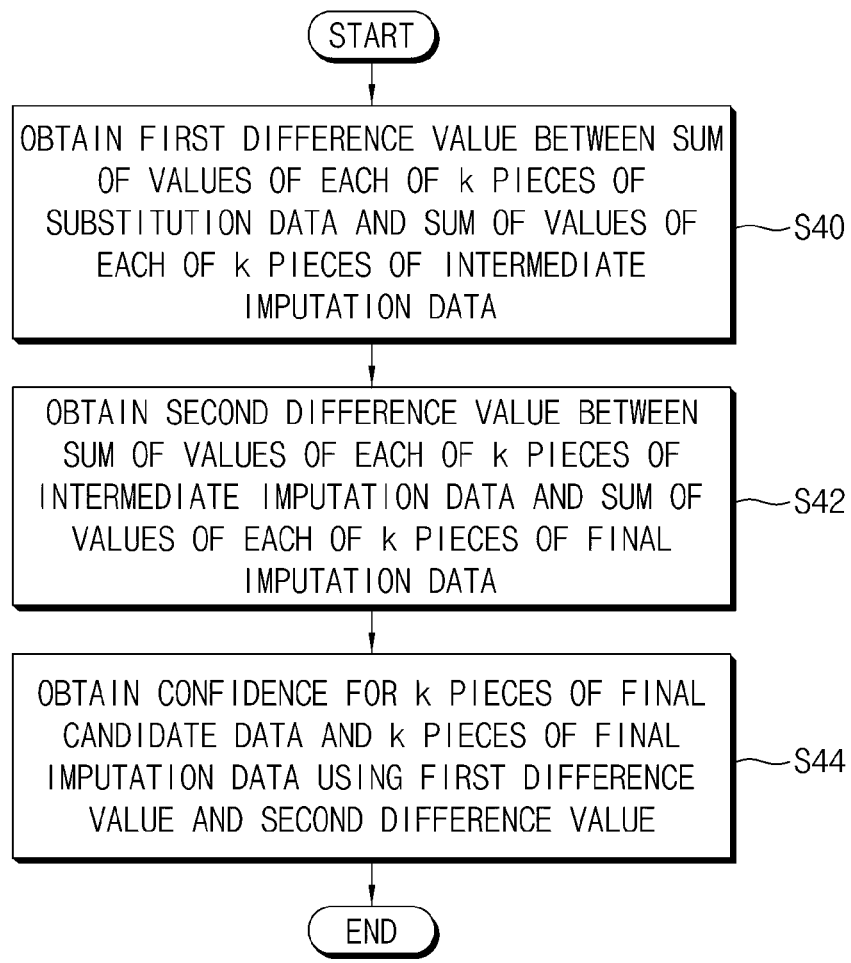
FIG. 6 is an operation flowchart describing an operation of a confidence generator according to an exemplary embodiment of the inventive concept.

FIG. 6 is an operation flowchart for describing an operation of a confidence generator according to an exemplary embodiment of the inventive concept.

The confidence generator 29-6 may obtain a first difference value between a sum of the substitution values of each of the k pieces of substitution data from sed1 to sedk and a sum of the intermediate imputation values of each of the k pieces of intermediate imputation data from mied1 to miedk, and generate k first difference values in step S40.

The confidence generator 29-6 may obtain a second difference value between a sum of the intermediate imputation values of each of the k pieces of intermediate imputation data from mied1 to miedk and a sum of the final imputation values of the k pieces of final imputation data from ied1 to iedk, and generate k second difference values in step S42.

The confidence generator 29-6 may obtain k accuracies for the k pieces of final candidate data from sed1 to sedk using the k first difference values and k accuracies for the k pieces of final imputation data from ied1 to iedk using the k second difference values, and generate k confidences cf1 to cfk in step S44. For example, the confidence generator 29-6 may determine the accuracy of each of the k pieces of final candidate data from fced1 to fcedk using the k first difference values, and determine whether the k pieces of final imputation data from ied1 to iedk are imputed to be close to the measurement values using the k second difference values.

The method of obtaining and imputing the missing data and the measurement system using the same according to an exemplary embodiment of the inventive concept will be described using an image obtained from the measurement object 16.

Figure 7:
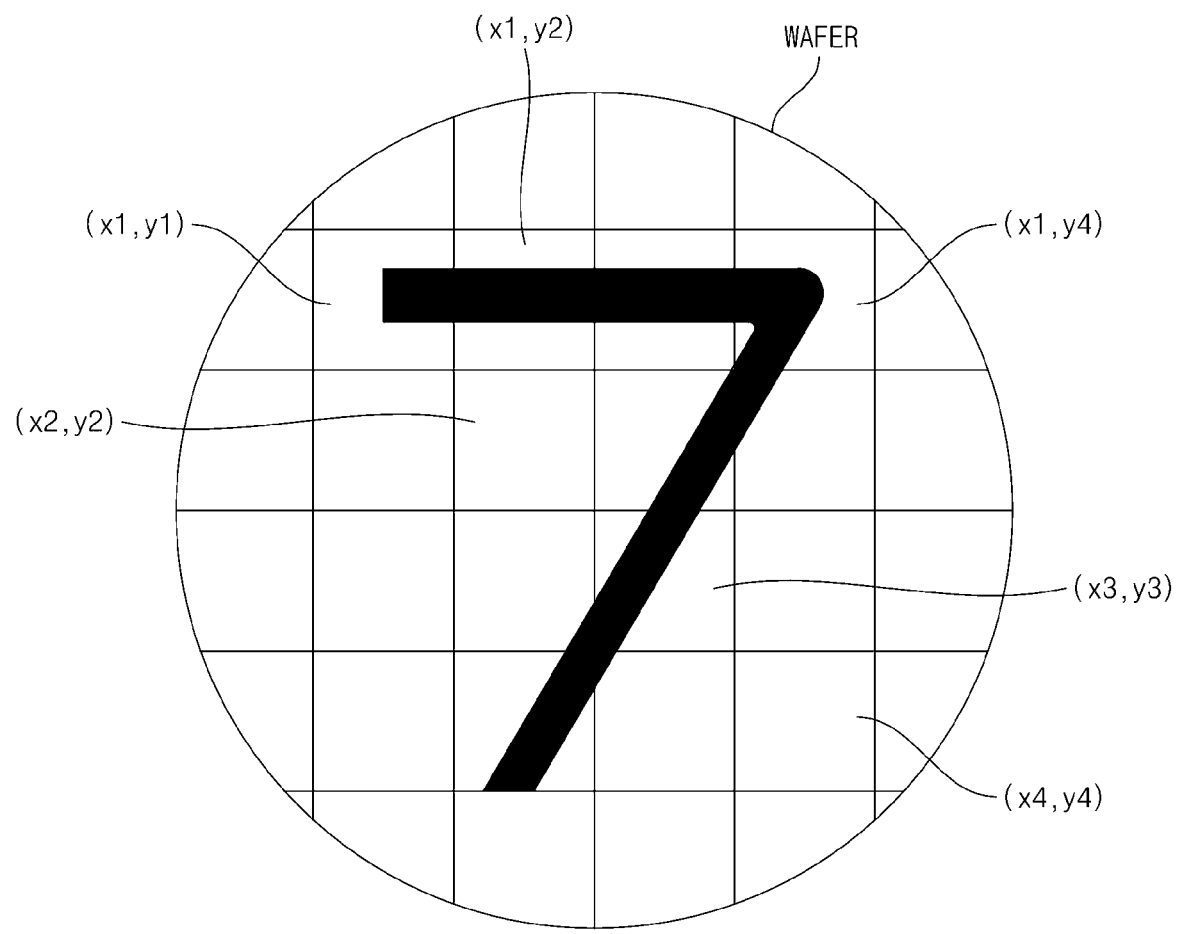
FIG. 7 is a diagram illustrating a measurement object according to an exemplary embodiment of the inventive concept.

FIG. 7 is a diagram illustrating a measurement object according to an exemplary embodiment of the inventive concept.

With reference to FIG. 1 and FIG. 7, a number "7" may be patterned on a wafer, images may be obtained from 16 positions (x1, y1) to (x4, y4) on the wafer by the measurement unit 12 of the measurement instrument 10. For example, a die may be integrated in each of the 16 positions (x1, y1) to (x4, y4) on the wafer.

FIG. 8 is a diagram illustrating complete data of a measurement object according to an exemplary embodiment of the inventive concept. When a complete image of a number "7" as shown in FIG. 7 includes 4×4 pixels, the complete data as shown in FIG. 8 may be expressed as 4×4 matrix data, and may be data in which pixel values of partial images of the 16 positions (x1, y1) to (x4, y4) as shown in FIG. 7 are expressed as values (gray scale values) of 0 to 15. For example, pixel values of partial images in components (x1, y1) to (x1, y4) of a first row of the complete data may be 3, 5, 5, 5, and pixel values of partial images in components (x4, y1) to (x4, y4) of a fourth row of the complete data may be 0, 4, 1, 0. Pixel values of partial images of a second row and pixel values of partial images of a third row of the complete data may be the same values as shown.

An operation of the measurement variable selector 28 will be described below in more detail with reference to FIG. 1 to FIG. 3 and FIG. 7 to FIG. 12.

FIG. 9 is a diagram illustrating missing data according to an exemplary embodiment of the inventive concept. The missing data ded may be expressed as 4×4 matrix data, and when a pixel value of a partial image obtained from the position (x3, y3) as shown in FIG. 7 is 4, a pixel value in a measurement component (x3, y3) of the missing data ded may be 4, and missing values in the remaining missing components of the missing data ded may be ?. For example, ? may be 0 or not a number (NaN), where NaN is a member of a numeric data type that can be interpreted as a value that is undefined or unrepresentable.

Figures 10, 11:
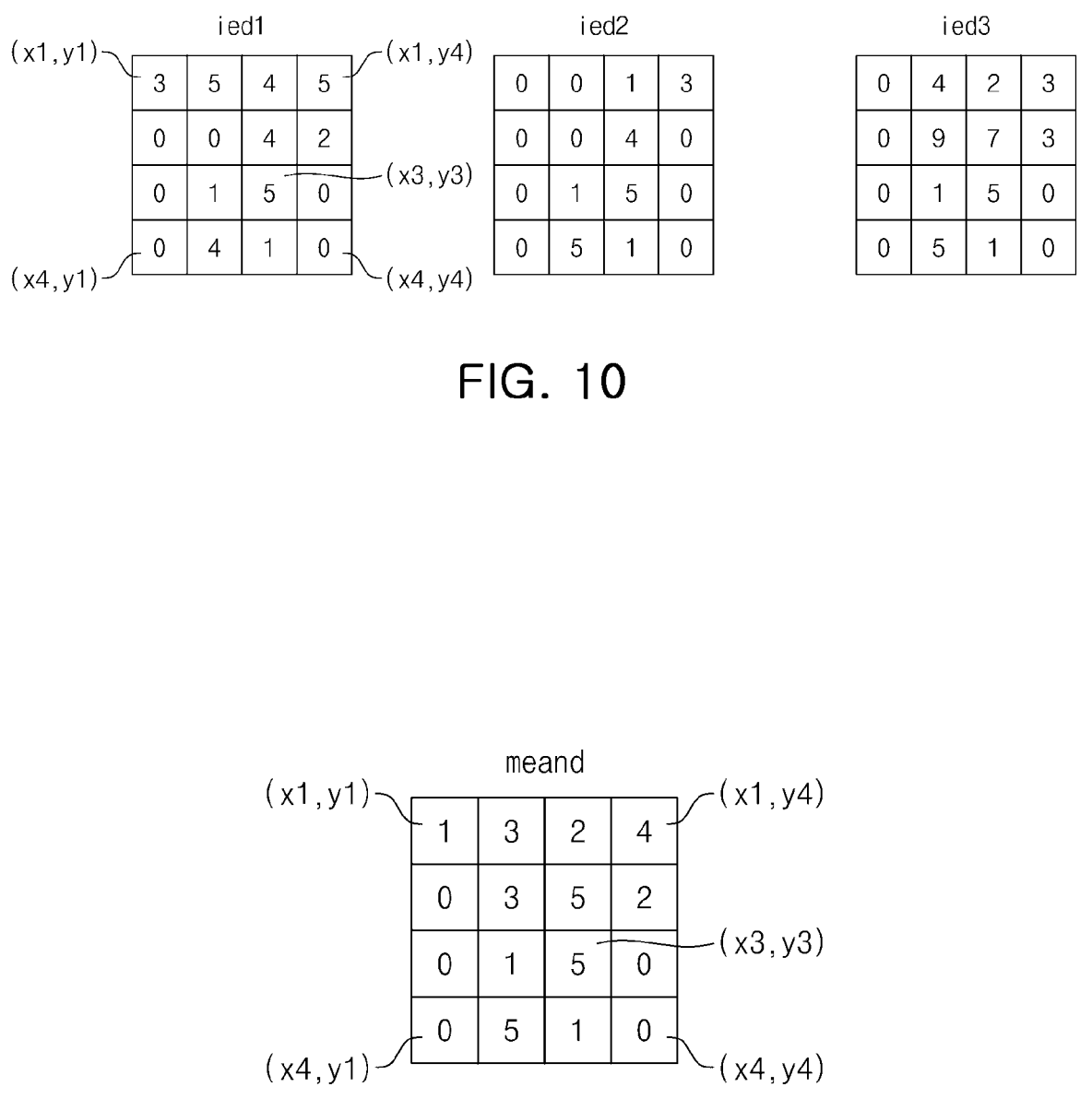

FIG. 10 is a drawing illustrating final imputation data according to an exemplary embodiment of the inventive concept. FIG. 10 illustrates three pieces of final imputation data from ied1, ied2, and ied3. Each of the three pieces of final imputation data from ied1, ied2, and ied3 may be expressed as 4×4 matrix data, and 16 final imputation values may be included in 16 components (x1, y1) to (x4, y4) of each of the three pieces of final imputation data from ied1, ied2, and ied3. For example, pixel values in components (x1, y1) to (x1, y4) of a first row of the final imputation data from ied1 may be 3, 5, 4, 5, pixel values in components (x1, y1) to (x1, y4) of a first row of the final imputation data ied2 may be 0, 0, 1, 3, and pixel values in components (x1, y1) to (x1, y4) of a first row of the final imputation data ied3 may be 0, 4, 2, 3. Pixel values in components of a second row to a fourth row of each of the three final imputation data from ied1, ied2, and ied3 may be the same values as shown.

FIG. 11 is a drawing illustrating average data according to an exemplary embodiment of the inventive concept. The average data meand may be data having an average value of three pieces of final imputation values in each of the components of the three final imputation data from ied1, ied2, and ied3 as shown in FIG. 10. The average data meand may be expressed as 4×4 matrix data, and 16 average values may be included in 16 components (x1, y1) to (x4, y4) of the average data meand. The average data meand may have a rounded value when the average value includes a value after a decimal point. For example, an average value in component (x1, y1) of the average data may be 3/3=1 since the three final imputation values in the component (x1, y1) of the three pieces of final imputation data from ied1, ied2, and ied3 are 3, 0, 0, and an average value in a component (x1, y4) of the average data meand may be 4 which is a rounded value of 13/3=4.3 since the three final imputation values in the component (x1, y4) of the three pieces of final imputation data from ied1, ied2, and ied3 are 5, 3, 3. Average values of the remaining components of the average data meand may be obtained in the same manner, and the average values in the remaining components of the average data meand may be the same as shown.

FIG. 12 is a diagram illustrating deviation data, sample variance data, and standard deviation data according to an exemplary embodiment of the inventive concept.

With reference to FIG. 12, each of the three pieces of deviation data dev1, dev2, and dev3 may be expressed as 4×4 matrix data, and may be data having a difference value between the final imputation value in each of the components of each of the three pieces of final imputation data from ied1, ied2, and ied3 as shown in FIG. 10 and the average value in each of components of the average data meand as shown in FIG. 11. For example, a component (x1, y1) of the deviation data dev1 may have 2 which is a difference value between values, that is, 3 and 1, of the components (x1, y1) of the final imputation data from ied1 and the average data meand, a component (x2, y3) of the deviation data dev2 may have 1 which is a difference value between values, that is, 4 and 5, in the components (x2, y3) of the final imputation data ied2 and the average data meand, and a component (x2, y2) of the deviation data dev3 may have 6 which is a difference value between values, that is, 9 and 3, in the components (x2, y2) of the final imputation data ied3 and the average data meand. Deviations of all components (x1, y1) to (x4, y4) may be obtained in the same manner, and may be the same as shown in FIG. 12.

With reference to FIG. 12, sample variance data vard may be expressed as 4×4 matrix data, and may have 16 sample variances included in 16 components (x1, y1) to (x4, y4). The sample variance data vard may have a rounded value when the sample variance includes a value after a decimal point. For example, a sample variance in a component (x1, y1) of the sample variance data vard may be a value, that is, 3, obtained by dividing 6 which is a sum of square values, that is, 4, 1, 1, of the values, that is, 2, 1, 1, in the components (x1, y1) of the three pieces of deviation data dev1, dev2, and dev3, by 2, and a sample variance in a component (x1, y2) of the sample variance data vard may be a value, that is, 7, obtained by dividing 14 which is a sum of square values, that is, 4, 9, 1, of the values, that is, 2, 3, 1, in the components (x1, y2) of the three pieces of deviation data dev1, dev2, and dev3, by 2. A sample variance in a component (x2, y2) of the sample variance data vard may be a value, that is, 27, obtained by dividing 54 which is a sum of square values, that is, 9, 9, 36, of the values, that is, 3, 3, 6, in the component (x2, y2) of the three pieces of deviation data dev1, dev2, and dev3, by 2. In the same manner, the sample variances in all components (x1, y1) to (x4, y4) may be obtained, and all components (x1, y1) to (x4, y4) may have the sample variances as shown in FIG. 12, a maximum sample variance may be obtained in the component (x2, y2) of the sample variance data vard, and a pixel of a partial image at a position (x2, y2) of the measurement object 16 corresponding to the component (x2, y2) having the maximum sample variance may be selected as a next measurement variable pd.

With reference to FIG. 12, the standard deviation data stddev may be expressed as 4×4 matrix data, and may include 16 standard deviations included in 16 components (x1, y1) to (x4, y4). The standard deviation data stddev may have a rounded value when the standard deviation includes a value after a decimal point. For example, a standard deviation in a component (x1, y1) of the standard deviation data stddev may be 2 which is a rounded value of a square root, that is, √3=1.73, of a value, that is, 3, in the component (x1, y1) of the sample variance data vard, a standard deviation of a component (x1, y2) of the standard deviation data stddev may be 3 which is a rounded value of a square root, that is, √7=2.64, of a value, that is, 7, in the component (x1, y2) of the sample variance data vard, and a standard deviation in a component (x2, y2) of the standard deviation data stddev may be 5 which is a rounded value of a square root, that is, √27=5.19, of a value, that is, 7, in the component (x2, y2) of the sample variance data vard. In the same manner, the standard deviations in all components (x1, y1) to (x4, y4) may be obtained, and all components (x1, y1) to (x4, y4) may have the standard deviations as shown in FIG. 12, a maximum standard deviation may be obtained in the component (x2, y2) of the standard deviation data stddev, and a pixel of a partial image at a position (x2, y2) of the measurement object 16 corresponding to the component (x2, y2) having the maximum standard deviation may be selected as a next measurement variable pd. In the same manner, when the standard deviations in the all components (x1, y1) to (x4, y4) are obtained, uncertainty data as shown in FIG. 12 may be obtained, and a pixel of a partial image at a position (x2, y2) of the measurement object 16 corresponding to the component (x2, y2) having a maximum uncertainty may be selected as a next measurement variable pd.

An operation of the multiple imputation data generator 29 will be described below in more detail with reference to FIG. 1 to FIG. 8 and FIG. 13 to FIG. 18.

FIG. 13 is a diagram illustrating missing data according to an exemplary embodiment of the inventive concept. The missing data ded may be expressed as 4×4 matrix data, and when pixel values corresponding to partial images obtained from five measurement positions (x1, y2), (x1, y3), (x2, y2), (x2, y3), and (x3, y3) as shown in FIG. 7 are 5, 5, 0, 4, 4, pixel values in five components (x1, y2), (x1, y3), (x2, y2), (x2, y3), and (x3, y3) of the missing data ded may be 5, 5, 0, 4, 4, and pixel values in the remaining components of the missing data ded may be the missing values. The missing values are represented by "?" in FIG. 13.

Figure 14:
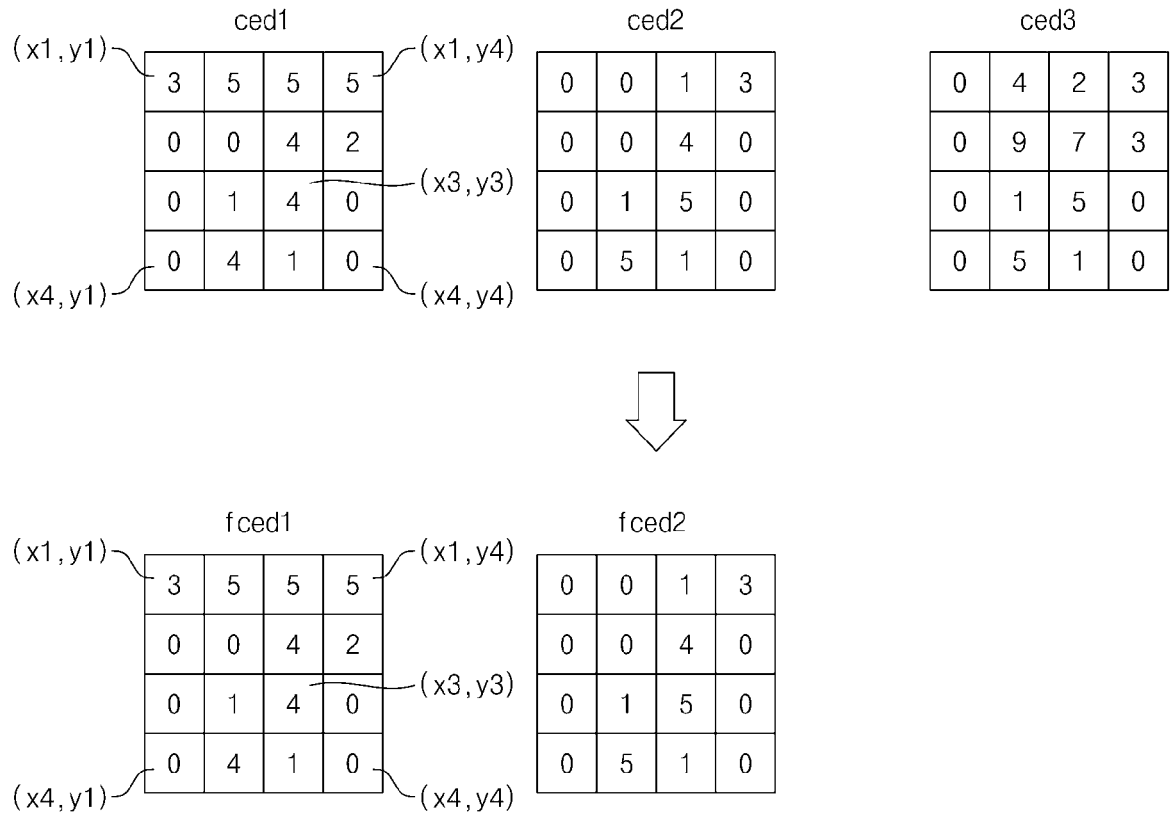
FIG. 14 is a diagram illustrating candidate data and final candidate data according to an exemplary embodiment of the inventive concept.

FIG. 14 is a diagram illustrating candidate data and final candidate data according to an exemplary embodiment of the inventive concept. FIG. 13 illustrates three pieces of candidate data ced1, ced2, and ced3, and two pieces of final candidate data from fced1 and fced2. Each of the three pieces of candidate data ced1, ced2, and ced3 and the two pieces of final candidate data from fced1 and fced2 may be expressed as 4×4 matrix data, and values in components may be the same as shown in FIG. 14.

With reference to FIG. 13 and FIG. 14, difference values, that is, 18−18=0, 18−10=8, 27−18=9, between a sum, that is, 5+5+0+4+4=18, of the measurement values of the missing data ded and sums, that is, 0, 10, 27, of the candidate values in components (x1, y2), (x1, y3), (x2, y2), (x2, y3), and (x3, y3) of each of the three pieces of candidate data ced1, ced2, and ced3 equal to the measurement components (x1, y2), (x1, y3), (x2, y2), (x2, y3), and (x3, y3) of the missing data ded, may be obtained as similarities. When a threshold value is 8, two pieces of candidate data ced1 and ced2 having the difference values, that is, 0, 8, may be selected as the final candidate data from fced1 and fced2, and the candidate data ced3 having the difference value, that is, 9, may not be selected as the final candidate data and thus may be dropped out.

Figure 15:
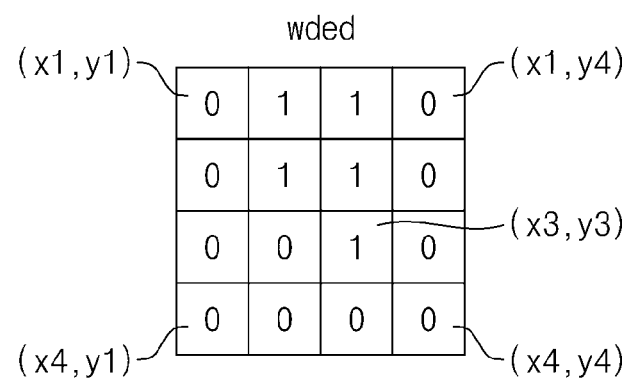
FIG. 15 is a diagram illustrating missing and measurement indication data according to an exemplary embodiment of the inventive concept.

FIG. 15 is a diagram illustrating missing and measurement indication data according to an exemplary embodiment of the inventive concept. FIG. 15 illustrates the missing and measurement indication data wded of the missing data ded as shown in FIG. 13.

With reference to FIG. 13 and FIG. 15, the missing and measurement indication data wded may be expressed as 4×4 matrix data, and may be data obtained by substituting the measurement values of the missing data ded as shown in FIG. 13 with "1" and the missing values of the missing data ded with "0".

FIG. 16 is a diagram illustrating substitution data according to an exemplary embodiment of the inventive concept. FIG. 16 illustrates two pieces of substitution data from sed1 and sed2 for two pieces of final candidate data from fced1 and fced2 as shown in FIG. 14.

With reference to FIG. 13 to FIG. 16, each of the two pieces of substitution data from sed1 and sed2 may be expressed as 4×4 matrix data, and substitution values in components of each of the two pieces of substitution data from sed1 and sed2 may be the same as shown. Each of the two pieces of substitution data from sed1 and sed2 may be data obtained by substituting the final candidate values in components of each of the two pieces of final candidate data from fced1 and fced2 equal to the measurement components ((x1, y2), (x1, y3), (x2, y2), (x2, y3), and (x3, y3) of the missing data ded with the measurement values, that is, 5, 5, 0, 4, 4, of the measurement components of the missing data ded.

FIG. 17 is a diagram illustrating intermediate imputation data according to an exemplary embodiment of the inventive concept. FIG. 17 illustrates two pieces of intermediate imputation data from mied1 and mied2 obtained by imputing the two pieces of substitution data from sed1 and sed2 as shown in FIG. 16, and each of the two pieces of intermediate imputation data from mied1 and mied2 may be expressed as 4×4 matrix data.

With reference to FIG. 17, the intermediate imputation data from mied1 may be data obtained by imputing the substitution values, that is, 1, 0, 1, in components (x3, y2), (x3, y4), and (x4, y3) of the substitution data from sed1 as 2, 1, 2, and the intermediate imputation data mied2 may be data obtained by imputing the substitution values, that is, 0, 4, 0, 1, 0, 1, in components (x1, y1), (x2, y3), (x2, y4), (x3, y2), (x4, y1), and (x4, y3) of the substitution data sed2 as 2, 3, 1, 2, 1, 2.

FIG. 18 is a diagram illustrating final imputation data according to an exemplary embodiment of the inventive concept. FIG. 18 illustrates two pieces of final imputation data from ied1 and ied2 obtained from the missing data ded as shown in FIG. 13 and the two pieces of intermediate imputation data from mied1 and mied2 as shown in FIG. 17, and each of the two pieces of final imputation data from ied1 and ied2 may be expressed as 4×4 matrix data.

With reference to FIG. 18, each of the two pieces of final imputation data from ied1 and ied2 may be data obtained by substituting the intermediate imputation values in components of each of the two pieces of intermediate imputation data from mied1 and mied2 equal to the measurement components (x1, y2), (x1, y3), (x2, y2), (x2, y3), and (x3, y3) of the missing data ded with the measurement values, that is, 5, 5, 0, 4, 4, in the measurement components of the missing data ded. In FIG. 18, the intermediate imputation value, that is, 3, in the component (x2, y3) of the intermediate imputation data mied2 may be substituted with 4.

As another example, two pieces of final imputation data from ied1 and ied2 may be obtained from the missing data ded as shown in FIG. 13, the missing and measurement indication data wded as shown in FIG. 15, and the two pieces of intermediate imputation data from mied1 and mied2 as shown in FIG. 17. For example, each of the two pieces of final imputation data from ied1 and ied2 may be data obtained by substituting the intermediate imputation values in components of each of the two pieces of intermediate imputation data from mied1 and mied2 equal to components (x1, y2), (x1, y3), (x2, y2), (x2, y3), and (x3, y3) having "1" of the missing and measurement indication data wded with the measurement values, that is, 5, 5, 0, 4, 4, in the measurement components of the missing data ded.

Further, an operation of the confidence generator 29-6 will be described below in more detail with reference to FIG. 16 to FIG. 18.

In one exemplary embodiment, the first difference value between a sum, that is, 34, of the substitution values of the substitution data from sed1 as shown in FIG. 16 and a sum, that is, 37, of the intermediate imputation values of the intermediate imputation data from mied1 as shown in FIG. 17 may be 3, and the first difference value between a sum, that is, 28, of the substitution values of the substitution data sed2 as shown in FIG. 16 and a sum, that is, 33, of the intermediate imputation values of the intermediate imputation data mied2 as shown in FIG. 17 may be 5. From this, it may be inferred that the final candidate from fced1 is more accurate candidate data than the final candidate data fced2.

The second difference value between a sum, that is, 37, of the intermediate imputation values of the intermediate imputation data from mied1 as shown in FIG. 17 and a sum, that is, 37, of the final imputation values of the final imputation data from ied1 as shown in FIG. 18 may be 0, and the second difference value between a sum, that is, 33, of the intermediate imputation values of the intermediate imputation data mied2 as shown in FIG. 17 and a sum, that is, 34, of the final imputation values of the final imputation data ied2 as shown in FIG. 18 may be 1. From this, it may be inferred that the final imputation data from ied1 is closer to the complete data as shown in FIG. 8 than the final imputation data ied2.

In exemplary embodiments described above, it has been described that the data is one-dimensional vector data or two-dimensional matrix data, but it may be three or more-dimensional data.

According to the exemplary embodiments of the inventive concept, the method of obtaining and imputing missing data and the measurement system using the same may not obtain the measurement values from all variables of the measurement object, and sequentially obtain the measurement value from a variable with high uncertainty to a variable with low uncertainty. Therefore, the uncertainty of the missing data may be effectively removed, and even though the number of measurement values is small, that is, even when a missing rate of the missing data is great, valid final imputation data may be obtained from the missing data.

Further, the method of obtaining and imputing missing data and the measurement system using the same may perform multiple imputations on the missing data with a high missing rate using a plurality of pieces of final candidate data to generate a plurality of pieces of final imputation data, and generate confidences for the plurality pieces of final candidate data and the plurality pieces of final imputation data, and thus select valid final candidate data and valid final imputation data.

Moreover, according to the exemplary embodiments of the inventive concept, the method of obtaining and imputing missing data and the measurement system using the same may effectively estimate a measurement result of the measurement object without obtaining all measurement values of the measurement object.

While the exemplary embodiments of the inventive concept have been described with reference to the accompanying drawings, it will be understood by those skilled in the art that various modifications may be made without departing from the scope of the inventive concept and without changing essential features thereof. Therefore, the above-described exemplary embodiments should be considered in a descriptive sense only and not for the purposes of limitation.

What is claimed is:

1. A method of obtaining and imputing missing data, comprising:
   obtaining measurement values of measurement variables, among z variables corresponding to z components of a measurement object, wherein
   z is a natural number greater than 1, and
   the z variables of the measurement object include measurement variables and missing variables which are not measured, and
   the measurement variables are of an amount less than z;
   generating missing data having the measurement variables with the measurement values and the missing variables with missing values in the z components, wherein each of the missing values is a predetermined value indicating that a missing variable has not been measured;
   generating, using a multiple imputation data generator, k pieces of final imputation data having k final imputation values, by receiving m pieces of candidate data, each including candidate values in the z components, wherein m is a natural number greater than or equal to k, and obtaining a difference value, as a similarity, between a sum of the measurement values in the measurement components of the missing data and a sum of candidate values in components of the z components of each of the m pieces of candidate data equal to the measurement components of the missing data, wherein
   k is a natural number greater than 1,
   each of the k final imputation values are in the z components, and
   using the missing data includes performing multiple imputations on the missing data; and
   generating average data having average component values in the z components, wherein each of the average component values in a component is an average value of the k final imputation values of the k pieces of final imputation data in the component, and
   selecting, using a measurement variable selector, a variable of a component having a maximum sample variance or a maximum standard deviation of final imputation values in the component of the k pieces of final imputation data, as a next measurement variable.

2. The method of claim 1, wherein selecting the next measurement variable comprises:
   obtaining k pieces of deviation data having z deviations in the z components, wherein each of the deviation is a difference value between the final imputation value and the average component value in each of the z components; and
   obtaining sample variance data having z sample variance in the z components using the deviations in each of the z components, or obtaining standard deviation data having in each of the z components a standard deviation.

3. The method of claim 1, wherein generating the k pieces of final imputation data further comprises:
   selecting k pieces of candidate data having the similarities smaller than or equal to a threshold value among the m similarities as k pieces of final candidate data;
   substituting final candidate values in components, among the z components of each of the k pieces of final candidate data equal to measurement components having the measurement values of the measurement variables of the missing data with the measurement values in measurement components of the missing data to generate k pieces of substitution data;
   imputing each of the k pieces of substitution data to generate k pieces of intermediate imputation data; and
   generating the k pieces of final imputation data for the k pieces of intermediate imputation data using the missing data.

4. The method of claim 3, wherein generating the k pieces of substitution data comprises:
   substituting final candidate values in components among the z components of each of the k pieces of final candidate data equal to the measurement components of the missing data with the measurement values in the measurement components of the missing data.

5. The method of claim 3, wherein generating the k pieces of final imputation data comprises:
   substituting intermediate imputation values in components among the z components of each of k pieces of intermediate imputation data equal to the measurement components of the missing data with the measurement values in the measurement components of the missing data.

6. The method of claim 4, further comprising:
   substituting the measurement values of the missing data with "1" and the missing values of the missing data with "0" to generate a missing and measurement indication data.

7. The method of claim 6, wherein generating the k pieces of final imputation data comprises:
substituting intermediate imputation values in components among the z components of each of the k pieces of intermediate imputation data equal to components having "1" of the missing and measurement indication data with the measurement value of the measurement components of the missing data.

8. The method of claim 5, further comprising:
obtaining a difference value between a sum of substitution values in the z components of each of the k pieces of substitution data and a sum of intermediate imputation values in the z components of each of the k pieces of intermediate imputation data to generate k first difference values;
obtaining a difference value between a sum of the intermediate imputation values in the z components of each of the k pieces of intermediate imputation data and a sum of the final imputation values in the z components of each of the k pieces of final imputation data to generate k second difference values; and
obtaining a confidence using the k first difference values and the k second difference values.

9. A method of obtaining and imputing missing data, comprising:
receiving m pieces of candidate data, each including candidate values in z components, wherein m is a natural number greater than 1, and z is a natural number greater than 1;
obtaining a similarity between each of the m pieces of candidate data and missing data to obtain m similarities by receiving m pieces of candidate data, each including candidate values in the z components, wherein m is a natural number greater than or equal to k, and obtaining a difference value, as a similarity, between a sum of the measurement values in the measurement components of the missing data and a sum of candidate values in components of the z components of each of the m pieces of candidate data equal to the measurement components of the missing data;
selecting, using a candidate data selector, k pieces of candidate data having a similarity smaller than or equal to a threshold value among the m pieces of candidate data as k pieces of final candidate data, wherein k is a natural number smaller than m;
substituting final candidate values in components among the z components of each of the k pieces of final candidate data equal to measurement components having measurement values of measurement variables among the z components of the missing data with the measurement value in the measurement components of the missing data to generate k pieces of substitution data;
imputing each of the k pieces of substitution data to generate k pieces of intermediate imputation data; and
generating k pieces of final imputation data for the k pieces of intermediate imputation data using the missing data;
selecting, using a measurement variable selector, a variable of a component having a maximum sample variance or a maximum standard deviation of final imputation values in the component of the k pieces of final imputation data, as a next measurement variable; and
obtaining a measurement value of the next measurement variable.

10. The method of claim 9, wherein the measurement values of n measurement variables among z variables of a measurement object are included in n measurement components of the z components of the missing data, and missing values are included in remaining z-n components of the z components of the missing data, wherein n is a natural number smaller than z.

11. The method of claim 10, wherein obtaining the similarity between each of the m pieces of candidate data and missing data comprises:
obtaining a difference value between a sum of the measurement values in the measurement components of the missing data and a sum of candidate values in components among the z components of each of the m pieces of candidate data equal to the measurement components of the missing data.

12. The method of claim 11, wherein substituting the final candidate values comprises:
substituting final substitution values in components among the z components of each of the k pieces of final candidate data equal to the measurement components of the missing data with the measurement values in the measurement components of the missing data to generate the k pieces of substitution data.

13. The method of claim 12, wherein generating the k pieces of final imputation data comprises:
substituting intermediate imputation values in components among the z components of each of the k pieces of intermediate imputation data equal to the measurement components of the missing data with the measurement value in the measurement components of the missing data.

14. A measurement system comprising:
a measurement instrument configured to generate a measurement value of at least one measurement variable among z variables of a measurement object in response to a driving control signal, wherein z is a natural number greater than 1; and
a controller configured to
obtain the measurement value of the measurement variable,
generate missing data having the measurement value of the measurement variable and missing values of remaining missing variables which are not measured, in z components,
obtain an average value of final imputation values of each component of k pieces of final imputation data to obtain average data having the average values in the z components,
select a variable of a component having a maximum simple variance or a maximum standard deviation except for the measurement variable as a next measurement variable using a difference value between the final imputation value and the average value of each component of each of the k pieces of final imputation data and the average data, and
generate the driving control signal based on the next measurement variable,
wherein the measurement values are obtained from n measurement variables among the z variables of the measurement object, k is a natural number, and n is a natural number smaller than z,
wherein the controller comprises a multiple imputation data generator configured to: receive m pieces of candidate data, each including candidate values in the z components, obtain a similarity between each of the m pieces of candidate data and the missing data to obtain m similarities, wherein m is a natural number greater than or equal to k, and the multiple imputation data generator comprises a final candidate data selector configured to obtain a difference value between a sum of the measurement values in the measurement components of the missing data and a sum of candidate values in components among the z components of each of the m pieces of candidate data equal to the measurement components of the missing data to obtain the m similarities.

15. The measurement system of claim 14, wherein the controller comprises:
a measurement variable selector configured to:
obtain a difference value between the final imputation value in each of the z components of each of the k pieces of final imputation data and the average value in each of the z components of the average data to obtain k pieces of deviation data having z deviations in the z components,
obtain sample variance data having z sample variances in the z components using the deviations in each of the z components of the k pieces of deviation data or obtain standard deviation data having z standard deviations in the z components, and
select the variable of the component having the maximum sample variance or the maximum standard deviation among the z sample variances or the z standard deviations as the next measurement variable; and
wherein the multiple imputation data generator is further configured to:
select k pieces of candidate data having the similarities smaller than or equal to a threshold value among the m similarities as k pieces of final candidate data,
substitute final candidate values in components among the z components of each of the k pieces of final candidate data equal to measurement components having the measurement values of the measurement variables of the missing data with the measurement values in the measurement components of the missing data to generate k pieces of substitution data,
impute each of the k pieces of substitution data to generate k pieces of intermediate imputation data, and
generate the k pieces of final imputation data for the k pieces of intermediate imputation data using the missing data.

16. The measurement system of claim 15, wherein the final candidate data selector is further configured to select k pieces of candidate data having a similarity smaller than or equal to a threshold value among the m similarities as the k pieces of final candidate data; and
wherein the multiple imputation data generator further comprises:

a substitution data generator configured to substitute final candidate values in components among the z components of each of the k pieces of final candidate data equal to the measurement components of the missing data with the measurement values in the measurement components of the missing data to generate the k pieces of substitution data;
an intermediate imputation data generator configured to impute each of the k pieces of substitution data to generate k pieces of intermediate imputation data; and
a final imputation data generator configured to substitute intermediate imputation values in components among the z components of each of k pieces of intermediate imputation data equal to the measurement components of the missing data with the measurement values in the measurement components of the missing data to generate the k pieces of final imputation data.

17. The measurement system of claim 16, further comprising:
a missing and measurement indication data generator configured to substitute the measurement values of the missing data with "1" and the missing values of the missing data with "0" to generate a missing and measurement indication data.

18. The measurement system of claim 17, wherein the final imputation data generator substitutes intermediate imputation values in components among the z components of each of the k pieces of intermediate imputation data equal to components having "1" of the missing and measurement indication data with the measurement value in the measurement components of the missing data to generate the k pieces of final imputation data.

19. The measurement system of claim 16, wherein the controller further comprises:
a confidence generator configured to
obtain a difference value between a sum of substitution values in the z components of each of the k pieces of substitution data and a sum of intermediate imputation values in the z components of each of the k pieces of intermediate imputation data to generate k first difference values,
obtain a difference value between a sum of the intermediate imputation values in the z components of each of the k pieces of intermediate imputation data and a sum of the final imputation values in the z components of each of the k pieces of final imputation data to generate k second difference values, and
obtain a confidence using the k first difference values and the k second difference values.

* * * * *